US012377765B2

(12) United States Patent
Bailey

(10) Patent No.: US 12,377,765 B2
(45) Date of Patent: Aug. 5, 2025

(54) VEHICLE INTERIOR ASSEMBLIES HAVING ELECTRICALLY CONDUCTIVE COATING LAYER(S) WITHIN THE A-SURFACE OF THEIR COVERS

(71) Applicant: Lear Corporation, Southfield, MI (US)

(72) Inventor: Christopher Todd Bailey, Warren, MI (US)

(73) Assignee: LEAR CORPORATION, Southfield, MI (US)

( * ) Notice: Subject to any disclaimer, the term of this patent is extended or adjusted under 35 U.S.C. 154(b) by 989 days.

(21) Appl. No.: 17/480,334

(22) Filed: Sep. 21, 2021

(65) Prior Publication Data

US 2023/0088201 A1    Mar. 23, 2023

(51) Int. Cl.
| | | |
|---|---|---|
| *B60N 2/58* | (2006.01) | |
| *B60N 2/56* | (2006.01) | |
| *B60Q 3/233* | (2017.01) | |
| *B60Q 3/283* | (2017.01) | |
| *B62D 1/06* | (2006.01) | |
| *H03K 17/96* | (2006.01) | |
| *H05B 1/02* | (2006.01) | |

(52) U.S. Cl.
CPC ............. *B60N 2/58* (2013.01); *B60N 2/5685* (2013.01); *B60Q 3/233* (2017.02); *B60Q 3/283* (2017.02); *B62D 1/065* (2013.01); *H03K 17/962* (2013.01); *H05B 1/0238* (2013.01); *H05B 2203/02* (2013.01)

(58) Field of Classification Search
CPC ........ B60N 2/58; B60N 2/5685; B60Q 3/233; B62D 1/065; H03K 17/962; H05B 1/0238; H05B 2203/02
See application file for complete search history.

(56) References Cited

U.S. PATENT DOCUMENTS

| | | |
|---|---|---|
| 6,545,236 B2 | 4/2003 | Valk et al. |
| 7,432,459 B2 | 10/2008 | Stoschek et al. |
| 8,507,102 B1 | 8/2013 | O'Leary |
| 8,723,043 B2 | 5/2014 | Weiss et al. |
| 9,159,221 B1 | 10/2015 | Stantchev |
| 10,272,836 B2 | 4/2019 | Ali et al. |
| 10,682,952 B2 | 6/2020 | Scott et al. |
| 10,742,061 B2 | 8/2020 | Ali et al. |

(Continued)

*Primary Examiner* — Elizabeth M Kerr
*Assistant Examiner* — Keith Brian Assante
(74) *Attorney, Agent, or Firm* — Brooks Kushman P.C.

(57) ABSTRACT

A vehicle interior assembly, such as a vehicle seat or a steering wheel, includes a cover assembly covering a frame. The cover assembly includes a vinyl or non-woven textile cover and an electrically conductive coating layer ("ECCL") within an A-surface of the cover. The ECCL may function as a heater, a capacitive touch control, or lighting. Another cover assembly includes first and second ECCLs within an A-surface of a cover. The first ECCL functions as a heater and the second ECL functions as a capacitive touch control. Another cover assembly includes an ECCL and a Positive Temperature Coefficient (PTC) coating layer within an A-surface of a cover. The ECCL functions as a heater dependent on current received from a power source via the PTC coating layer. The PTC coating layer regulates the current received by the ECCL from the power source dependent on a temperature of the PTC coating layer.

20 Claims, 4 Drawing Sheets

(56) References Cited

U.S. PATENT DOCUMENTS

| | | | |
|---|---|---|---|
| 10,875,430 B2 | 12/2020 | Bailey | |
| 10,953,793 B2 | 3/2021 | Ali et al. | |
| 2013/0249258 A1 | 9/2013 | Kortwig | |
| 2015/0163862 A1* | 6/2015 | Chabach | H05B 3/342 |
| | | | 219/481 |
| 2015/0195870 A1* | 7/2015 | Chabach | H05B 3/12 |
| | | | 219/507 |
| 2016/0052432 A1* | 2/2016 | Lafferty | B60N 2/5685 |
| | | | 297/180.12 |
| 2016/0264078 A1 | 9/2016 | McGuire, Jr. et al. | |
| 2019/0008050 A1 | 1/2019 | Ali et al. | |
| 2019/0077310 A1* | 3/2019 | Scott | H05K 1/0283 |
| 2019/0077311 A1* | 3/2019 | Ali | H01L 25/167 |
| 2019/0226879 A1* | 7/2019 | Lakatos | G01V 3/08 |
| 2022/0314851 A1* | 10/2022 | Pereny | B60N 2/5635 |

\* cited by examiner

VEHICLE INTERIOR ASSEMBLIES HAVING ELECTRICALLY CONDUCTIVE COATING LAYER(S) WITHIN THE A-SURFACE OF THEIR COVERS

TECHNICAL FIELD

The present invention relates to vehicle interior assemblies having A-surfaces.

BACKGROUND

Vehicle interior assemblies ordinarily have covers. For instance, a vehicle seat has a cover which is the outer component of the upholstery of the seat. Likewise, a vehicle steering wheel has a cover that is wrapped around the frame of the steering wheel. The "A-surface" of a cover of a vehicle interior assembly is the surface of the cover that is visible to and accessible by a vehicle occupant. For instance, the A-surface of the cover of a vehicle seat is the surface of the cover that is visible to and directly contacted by a vehicle occupant sitting on the seat. Likewise, the A-surface of the cover of a vehicle steering wheel is the surface of the cover that is visible to and directly contacted by a vehicle driver when steering the vehicle.

SUMMARY

In one variation, a vehicle interior assembly includes a frame and a cover assembly covering the frame. The cover assembly includes a cover that is a vinyl or non-woven textile and an electrically conductive coating layer within an A-surface of the cover.

The cover assembly may further include a base coat on the cover, a color coat, and a topcoat on the color coat with the electrically conductive coating layer being between the base coat and the color coat.

The electrically conductive coating layer may function as: an electrical resistance heater and is connectable to wiring of an electrical power source of a vehicle; an electrically conductive touch control and is connectable to wiring of a control system of a vehicle; or electroluminescent or electrochromic lighting and is connectable to wiring of a lighting system of a vehicle.

The vehicle interior assembly may be a vehicle seat, instrument panel, console, or a steering wheel.

The electrically conductive coating layer may include electrically conductive coating film areas which are patterned or spaced apart with conductive traces to allow perforation or quilting of the cover.

The electrically conductive coating layer may include first and second electrically conductive coating film areas positioned at respective first and second zones. The first and second electrically conductive coating film areas functioning as first and second electrical resistance heaters, respectively, and being independently connectable to wiring of an electrical power source of a vehicle. Similarly, the electrically conductive coating layer can be sectioned into one or more zones. These zoned electrically conductive coating film areas functioning as electrical resistance heaters and being independently connectable to wiring of an electrical power source of a vehicle.

In another variation, a vehicle interior assembly includes a frame and a cover assembly covering the frame. The cover assembly includes a cover, a first electrically conductive coating layer within an A-surface of the cover, a second electrically conductive coating layer within the A-surface of the cover, and an insulator sandwiched between the first and second electrically conductive coating layers within the A-surface of the cover. One of the first and second electrically conductive coating layers functions as an electrical resistance heater and is connectable to wiring of an electrical power source of a vehicle and the other one of the first and second electrically conductive coating layers functions as a capacitive conductive touch control and is connectable to wiring of a control system of the vehicle.

The cover may be a vinyl, a non-woven textile, or a leather. The vehicle interior assembly may be a vehicle seat, instrument panel, console, or a steering wheel.

In another variation, a vehicle interior assembly includes a frame and a cover assembly covering the frame. The cover assembly includes a cover, an electrically conductive coating layer within an A-surface of the cover, and a Positive Temperature Coefficient (PTC) coating layer within the A-surface of the cover and in physical contact with the electrically conductive coating layer. The electrically conductive coating layer functions as an electrical resistance heater dependent on an amount of electrical current received from an electrical power source via the PTC coating layer. The PTC coating layer regulates the amount of electrical current received by the electrically conductive coating layer from the electrical power source dependent on a temperature of the PTC coating layer.

The cover may be a vinyl, a non-woven textile, or a leather. The vehicle interior assembly may be a vehicle seat, a console, or a steering wheel.

In embodiments, an electrically conductive coating layer(s) is incorporated in the A-surface of trim material of a vehicle interior assembly to provide resistive heating and/or capacitive touch. In embodiments, the trim material is a vinyl, a non-woven textile, genuine leather, or a bonded or polyurethane leather. This enables uniform vehicle interior assembly solution regardless of trim level.

In embodiments, the electrically conductive coating layer(s) incorporated in the A-surface of trim material of a vehicle interior assembly may be continuous or optimized in connected patterns to provide optimized heating zones. Patterns can be designed to allow secondary operations including perforation, quilting, or specialized stitching. The electrically conductive coating layer(s) is compatible with High-Definition Design (HDD) radio frequency welding technology.

In embodiments, an electrically conductive coating layer in a pattern or specific element shape is utilized on the A-surface of trim material of a vehicle interior assembly for capacitive touch or other proximity vehicle occupant sensors, including embedded controls within the trim material. These can be applied as multiple electrically conductive coating layers separated by an insulator or dielectric coating layer for additive functionality.

In other embodiments, the leather covers are of vehicle interior assemblies such as steering wheels, consoles, interior trim surfaces, ceiling surface, and the like which may typically not have leather covers.

In embodiments, the electrically conductive coating is applied to the leather cover of vehicle interior assemblies such as steering wheels, mid seating consoles, arm rests, etc., to provide electrically conductive touch control functionality. That is, the electrically conducive coating functions as one or more electrically conductive touch controls.

In embodiments, the electrically conductive coating is applied to the leather cover of vehicle interior assemblies such as steering wheels, mid seating consoles, arm rests, etc., to provide electrical resistance heating functionality.

The electrically conducive coating functions as an electrical resistance heater having a plurality of electrical resistance heating elements. The electrical resistance heating elements are placed into the leather cover as a polymer film (i.e., the electrically conductive coating).

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
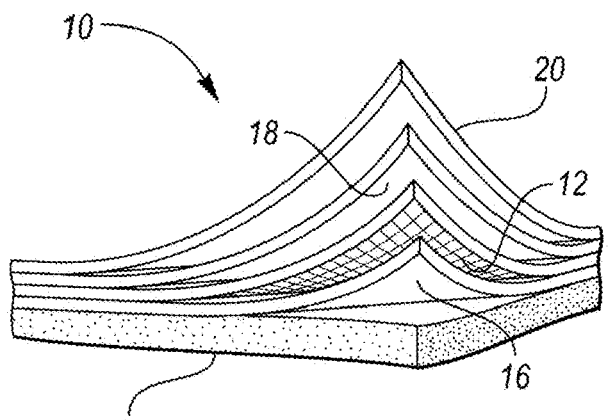
FIG. 1 illustrates a cross-sectional, perspective view of a cover assembly for a vehicle interior assembly, the cover assembly including a cover and an electrically conductive coating layer within an A-surface of the cover.

Referring now to FIG. 1, a cross-sectional, perspective view of a cover assembly 10 for a vehicle interior assembly is shown. Cover assembly 10 includes a cover 14. For instance, cover 14 is a trim material such as vinyl, a non-woven textile, genuine leather, a bonded leather, or a polyurethane leather. Cover assembly 10 further includes an electrically conductive coating layer 12 within an A-surface of cover 14. Cover assembly 10 further includes a base coat 16, a color coat 18, and a topcoat 20. Base coat 16, color coat 18, and topcoat 20 are on the finish side (i.e., the A-surface) of cover 14 and form a finishing stack of cover assembly 10. Base coat 16 is applied directly on cover 14, topcoat 20 is the outermost coat of the finishing stack, and color coat 18 is between base coat 16 and topcoat 20.

As indicated, electrically conductive coating layer 12 is integrated within the finishing stack (i.e., within the A-surface) of cover assembly 10. Particularly, as shown in FIG. 1, electrically conductive coating layer 12 is sandwiched between base coat 16 and color coat 18. Color coat 18 may be a strong color coat to mask appearance of electrically conductive coating layer 12. Topcoat 20 is to be capable of insulating a user in contact with cover assembly 10 from electrical current traveling through electrically conductive coating layer 12.

As indicated in FIG. 1, electrically conductive coating layer 12 is a thin film or layer. Electrically conductive coating layer 12 can be in the form of graphene/carbon nanotubes, silver/nickel, indium tin oxide, etc.

As described herein, adding a thin layer in the form of electrically conductive coating layer 12 into the finishing stack of cover assembly 10 as shown in FIG. 1 enables the cover assembly to have a variety of technologies. These technologies include integrated touch controls, which relate to control features; integrated resistive heating, which relates to comfort features; and electroluminescent or electrochromic (color changing) lighting, which relate to beauty features. With the application of electrically conductive coating layer 12 into cover assembly 10, cover 14, in addition to functioning as an ordinary cover, becomes an electrical device having its own level of additional requirements.

Figure 2A:
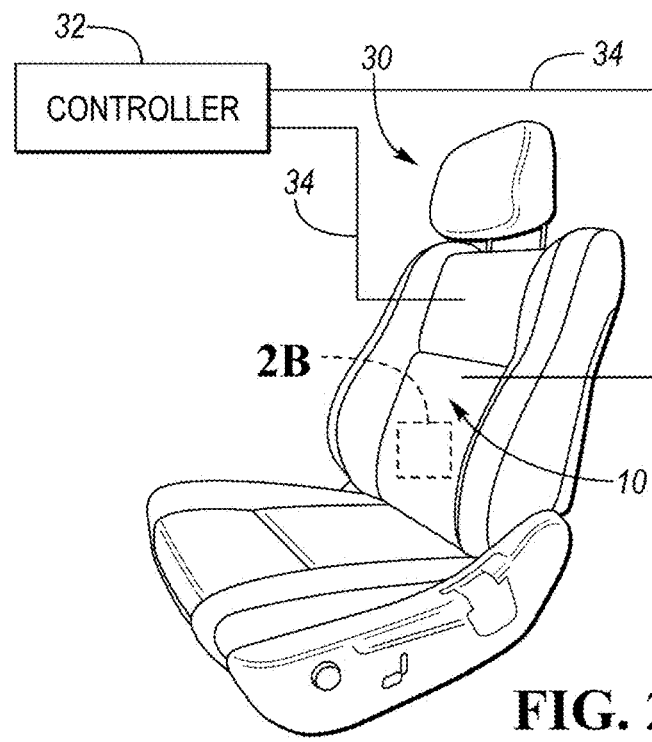
FIG. 2A illustrates a perspective view of a vehicle seat having the cover assembly, the electrically conductive coating layer of the cover assembly functioning as an electrical resistive heater.

Referring now to FIG. 2A, with continual reference to FIG. 1, a perspective view of a vehicle seat 30 having cover assembly 10 is shown. Electrically conductive coating layer 12 of cover assembly 10 functions as an electrical resistive heater having a plurality of electrical resistance heating elements. Electrically conductive coating 12 is connected to a vehicle controller 32 via conventional wiring 34 such as a vehicle wiring harness. Controller 32 communicates electrical power electrical signals to electrically conductive coating layer 12 via conventional wiring 34. Electrically conductive coating layer 12 generates heat according to Ohm's law as the electrical power electrical signals travel over electrically conductive coating layer 12. As such, electrically conductive coating layer 12 provides surface resistive heating.

The integrated heater is to heat up the body of an occupant of vehicle seat 30. By placing the electrical resistance heating elements in the form of electrically conductive coating layer 12 into cover assembly 10, relatively lower electrical current is required for the same degree of heating due to the proximity of electrically conductive coating layer 12 to the seat occupant's body. This provides higher electrical efficiency for heating as the heating felt by the seat occupant is not defused by foams or laminates of the seat which otherwise occurs with conventional heating elements located within the upholstery of the seat. In this way, cover assembly 10 includes A-surface resistive heating.

Figure 2B:
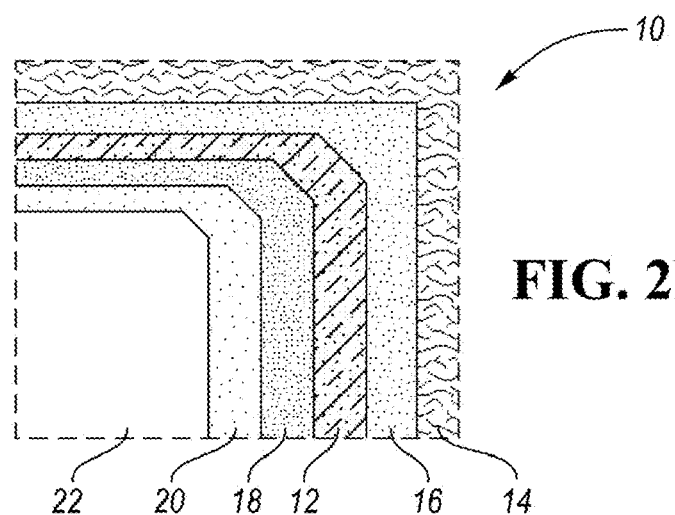
FIG. 2B illustrates an enlarged view of a portion of the cover assembly of the vehicle seat shown in FIG. 2A.

FIG. 2B illustrates an enlarged view of a portion of cover assembly 10 of vehicle seat 30. Electrically conductive coating layer 12 being placed as part of the surface finish side (i.e., the A-surface) of cover assembly 10, as shown in FIG. 2B, results in electrical efficiency for heating and has no insulation loss from cover 14. As shown in FIG. 2B, cover assembly 10 includes a final top layer 22 on topcoat 20 whereby final top layer 22, and not topcoat 20, is the outermost coat of the finishing stack of cover assembly 10. Topcoat 20 has a durable finish and provides an electrical insulative barrier to the seat occupant. The backside of cover 14 provides an electrical and thermal barrier to the internal seat construction.

As described, electrically conductive coating layer 12 of cover assembly 10 of vehicle seat 30 satisfies the development of an integrated conductive coating for a trim material finishing system which provides high efficiency heating for seat occupant comfort. Applying an electrical current to a polymer matrix utilizing conductive elements such as graphite, carbon nanotubes, or silver/nickel alloys allows for the generation of heat. This matrix can be applied to cover 14 at specific thicknesses and patterns to optimize resistive element areas.

To maintain effective uniform heating across the surface of cover 14, the conductance of electrically conductive coating layer 12 has to be uniform for the electrically conductive coating layer to produce the same heating efficiencies. The conductance is based on the film sheet thickness of electrically conductive coating layer 12. If the film sheet thickness is relatively thick in an area, then the resistance will be relatively low in this area and thus not enough electrical current will convert to heat. If the film sheet thickness is relatively thin in an area, then the resistance will be relatively high in this area and thus can get too hot thereby possibly damaging electrically conductive coating layer 12 and/or cover 14. If the film sheet thickness in an area is so thin that the conductive molecules of electrically conductive coating layer 12 cannot touch, then electron transfer will not occur at all and no heat will be produced in the area thereby creating a cold spot. Thus, application uniformity of electrically conductive coating layer 12 is important.

Further, as long as resistive heating conductive coating layers are uniform, heating can be expected regardless of substrate utilized as long as the material is non-conductive such as an insulator or dielectric. While leather is normally considered as a relatively good insulator, electrically conductive coating layers 12 can be applied to vehicle interior covers in the form of vinyl or textiles. With surface materials that have a rough surface topography in which direct application of an electrically conductive coating layer would create a non-uniform application, transfer papers can be used to create the conductive film. Then this film could be applied with a non-conductive laminating adhesive.

Figure 3:
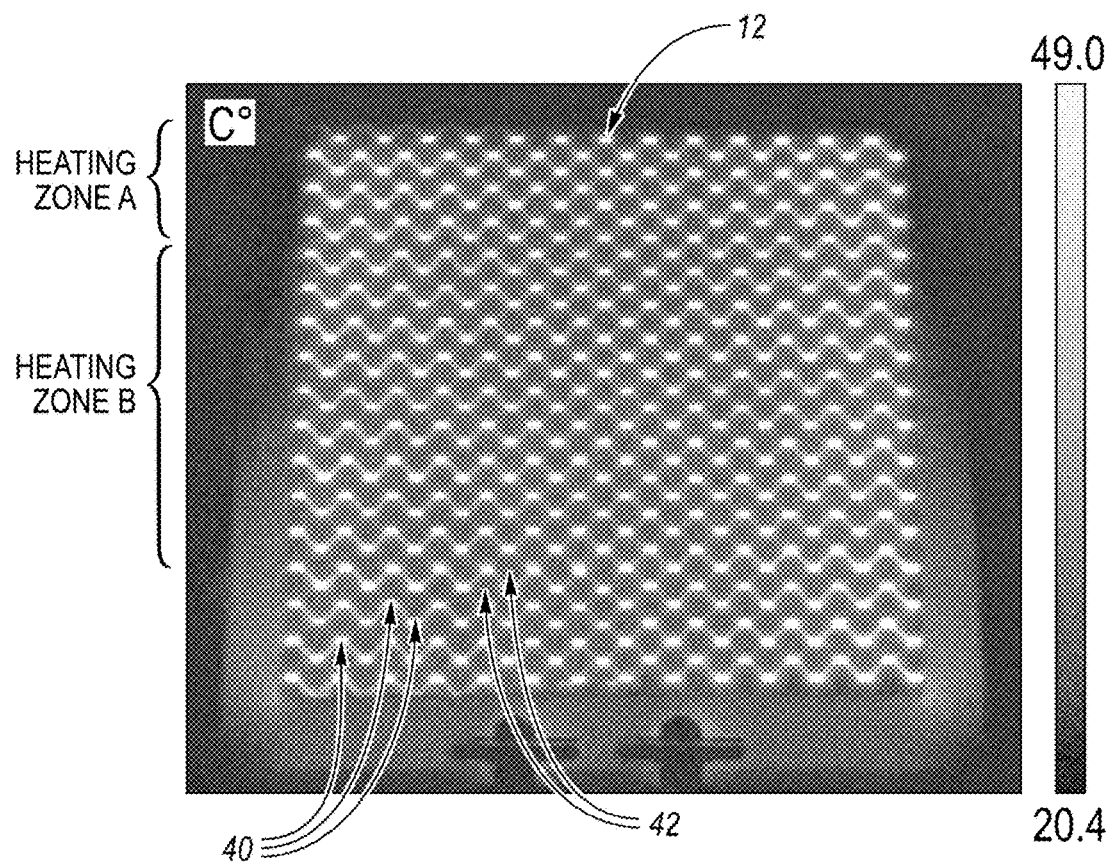
FIG. 3 illustrates a planar schematic view of an electrically conductive coating layer of the cover assembly in accordance with an embodiment.

Referring now to FIG. 3, with continual reference to FIGS. 1 and 2, a planar schematic view of electrically conductive coating layer 12 of cover assembly 10 in accordance with an embodiment is shown. As shown in FIG. 3, electrically conductive coating layer 12 includes a plurality of conductive coating film areas 40. Spacing, indicated by reference numeral 42, is allowed for perforation of cover 14. This keeps the conductive coating films isolated from occupant contact due to insulating topcoats.

With reference to FIG. 3, regarding continuous vs. zoned, while continuous conductive layers have been able to be shown to withstand general sewing and HDD welding for seating surfaces, it may be necessary to keep these film surfaces free from interference, especially if the operation may create surface exposure to the occupant. Perforation is one example of this. Thus, the film application can be staggered to enable custom perforation or quilting. Staggered zones, such as heating zone A and heating zone B indicated in FIG. 3, could also be independently wired to allow heating in only specific regions or in different amounts. This would enable customized occupant comfort. If integrated into the vehicle infotainment system, then the preferences could be stored as part of the occupant profile.

Figure 4:
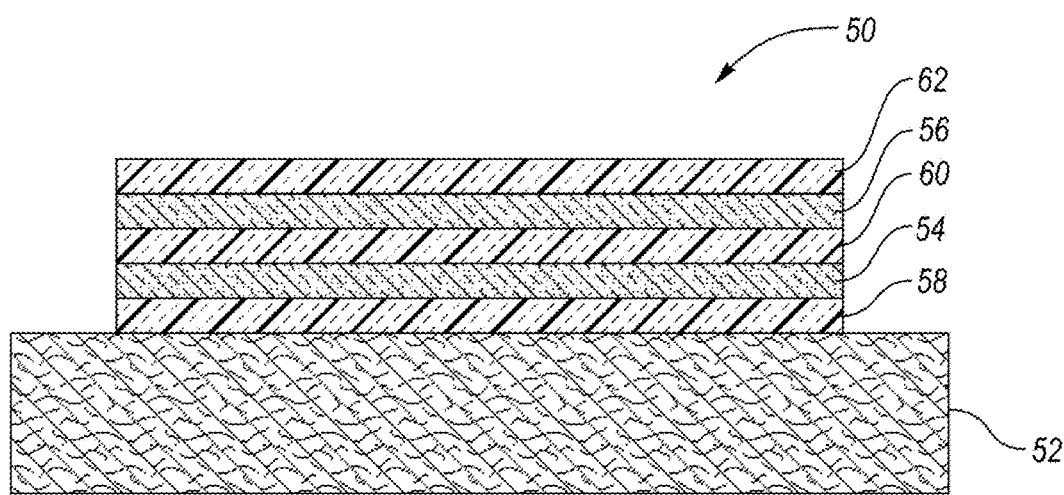
FIG. 4 illustrates a cross-sectional view of a cover assembly for a vehicle interior assembly, the cover assembly including a cover and multiple electrically conductive coating layers within an A-surface of the cover.

Referring now to FIG. 4, with continual reference to FIG. 1, a cross-sectional view of a cover assembly 50 for a vehicle interior assembly is shown. The vehicle interior assembly in which cover assembly 50 is provided may be a vehicle seat, a steering wheel, a door panel, a roof liner, and the like.

Cover assembly 50 includes a cover 52 and first and second electrically conductive coating layers 54 and 56 within an A-surface of the cover. Cover 52, as an example, is leather as labeled in FIG. 4. In other embodiments, cover 52 is some other type of flexible substrate such as a vinyl or non-woven textile.

Cover assembly 50 includes multiple electrically conductive coating layers by virtue of having first and second electrically conductive coating layers 54 and 56. The multiple electrically conductive coating layers are stacked to imbed multiple functions onto cover 52. For instance, in the example shown in FIG. 4, first electrically conductive coating layer 54 functions as an electrical resistance heater and second electrically conductive coating layer 56 functions as a capacitive conductive touch control. As further shown in FIG. 4, first and second electrically conductive coating layers 54 and 56 have appropriate insulating layers 58, 60, and 62 between them to prevent electrical arcing.

However once separate, functionality can be tailored to specific requirements. For example, per FIG. 4, a capacitive touch layer can be applied over a resistive heating layer for a steering wheel. This would enable vehicle operator controls on a heated control surface. Another consideration would be to use an electrically conductive layer as an occupant sensor. This could be placed above a resistive heating layer within a vehicle seat. Placing different electrically conductive layers within the seat's A-surface material then can reduce the number of seat components needed for final assembly.

Figure 5:
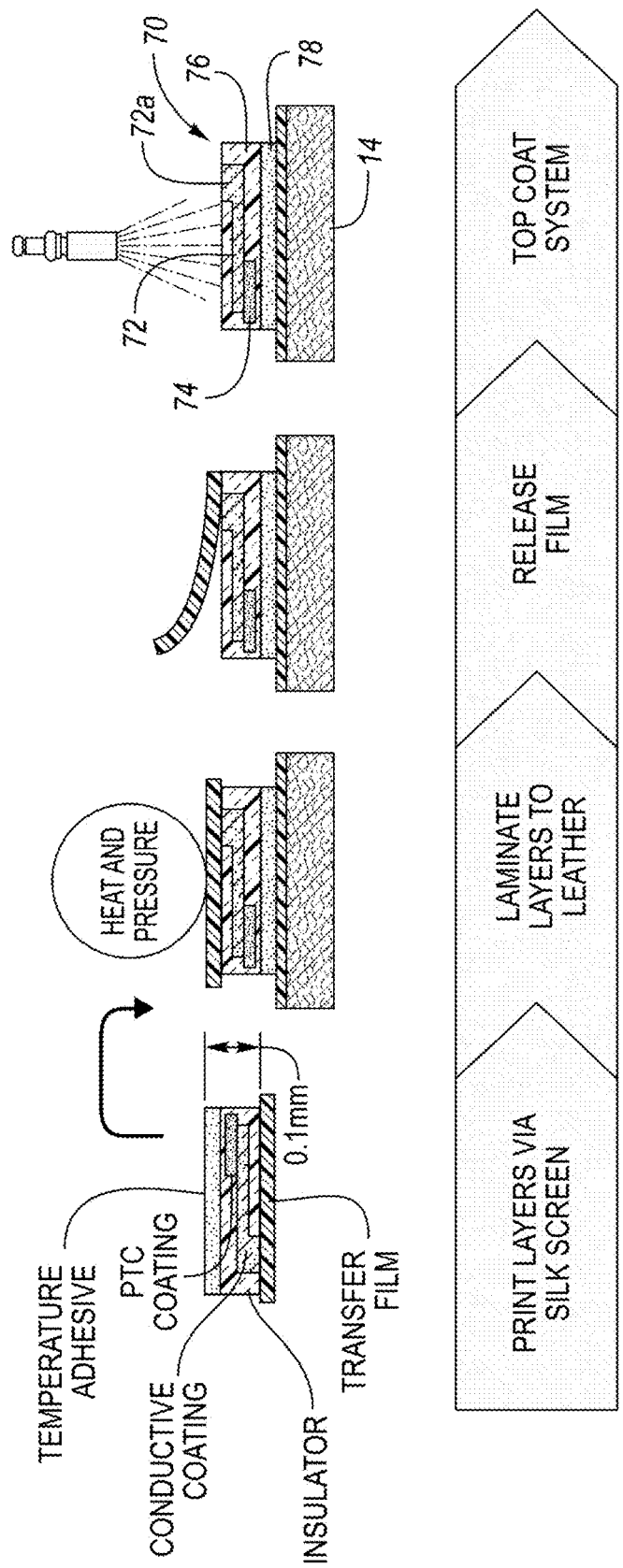
FIG. 5 illustrates a process diagram of a cover assembly for a vehicle interior assembly, the cover assembly including a cover, an electrically conductive coating layer within an A-surface of the cover, and a Positive Temperature Coefficient (PTC) coating layer within the A-surface of the cover and in a cooperative arrangement with the electrically conductive coating layer.

Referring now to FIG. 5 a process diagram of a cover assembly 70 for a vehicle interior assembly is shown. Cover assembly 70 includes a cover 14, an electrically conductive coating layer 72 within an A-surface of the cover, and a Positive Temperature Coefficient (PTC) coating layer 74 within the A-surface of the cover. PTC coating layer 74 is in a cooperative arrangement (i.e., in physical contact) with electrically conductive coating layer 72 as shown in FIG. 5. As shown in FIG. 5, electrically conductive coating layer 72 has a second partial electrically conductive coating layer, indicated by reference numeral 72a, whereby in a section electrically conductive coating layer 72 is effectively two layers.

Cover assembly 70 further includes an insulator layer 76 which insulates electrically conductive coating layer 72 and PTC coating layer 74. Cover assembly 70 further includes a temperature adhesive layer 78. As part of the process for forming cover assembly 70, cover assembly 70 initially further includes a transfer film, which is peeled off during the forming process.

The process diagram shown in FIG. 5 depicts an A-surface heating transfer process of a PTC layer. As part of the process, for example, conductive coating layers are transferred to base coated leather blockers (in the case of cover 14 being leather). Color and topcoats are applied for obfuscation and durability. Then final parts are trimmed to size.

As is known, the electrical resistance of PTC coating layer 74 increases significantly once the temperature of PTC coating layer 74 increases past a certain temperature. The certain temperature is the Curie or switch temperature. Accordingly, PTC coating layer 74 can be formulated for a specific limiting (switch) temperature. That is, PTC coating layer 74 can be formulated (i) to switch to a relatively high resistance (i.e., switch OFF) when the temperature of PTC coating layer 74 increases past the certain temperature and (ii) to switch to a relatively low resistance (i.e., switch ON) when the temperature of PTC coating layer 74 decreases past the certain temperature.

As such, PTC coating layer 74 functions as a switch which can be turned on to let electricity provided by a source to pass through or turned off to prevent electricity provided by the source from passing through. As PTC coating layer 74 is in physical contact with electrically conductive coating layer 72, PTC coating layer functions as a switch for the electrically conductive coating layer. That is, when the temperature of PTC coating layer 74 decreases past the switch temperature, electricity from the source passes through PTC coating layer 74 and to electrically conductive coating layer 72 thereby causing electrically conductive coating layer 72 to be heated. Likewise, when the temperature of PTC coating layer 74 increases past the switch temperature, electricity from the source does not pass from PTC coating layer 74 to electrically conductive coating layer 72 thereby causing electrically conductive coating layer 72 to be cooled. In this way, the temperature of electrically conductive coating layer 72, and thereby the heat generated by electrically conductive coating layer 72, is regulated to a desired setting.

The vehicle interior assembly in which cover assembly 70 is provided may be a vehicle seat, a steering wheel, a door panel, a roof liner, and the like. Advantages of cover assembly 70, as well as the other cover assemblies described herein, may include: rapid heating for occupants (for example, vehicle seat is warmed before leaving driveway); less energy consumption due to proximity (no insulating foams, padding, or surface materials); incorporates into leather trim seat constructions; and ideal of electric vehicles (increases vehicle range).

Figure 6:
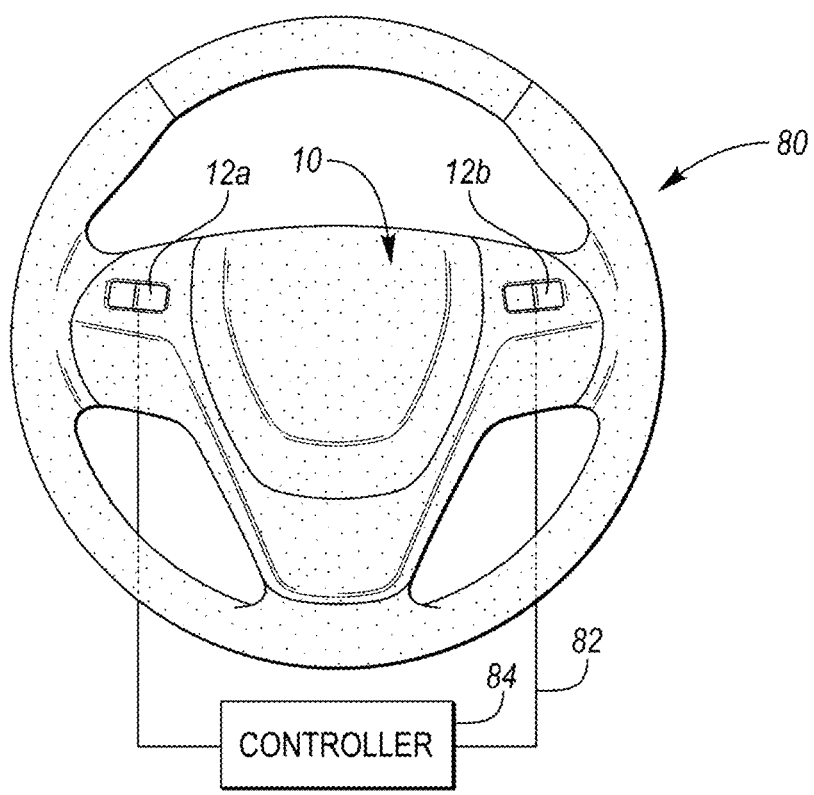
FIG. 6 illustrates a perspective view of a vehicle steering wheel having a cover assembly including a cover and an electrically conductive coating layer within an A-surface of the cover, the electrically conductive coating layer of the cover assembly functioning as electrically conductive touch controls or switches.

Referring now to FIG. 6, with continual reference to FIG. 1, a perspective view of a vehicle steering wheel having cover assembly 10 is shown. Electrically conductive coating layer 12 of cover assembly 10 functions as electrically conductive touch controls or switches. (Of course, as described with respect to FIG. 4, cover assembly 10 may include an additional electrically conductive layer in the stack for functioning as an electrical resistive heater.)

Electrically conductive coating layer 12, for example, includes first and second electrically conductive coating portions 12a and 12b. Electrically conductive coating portions 12a and 12b are positioned at respective locations of steering wheel 80. Electrically conductive coating portions 12a and 12b are respectively connected to conventional wiring 82 extending through the steering system. Electrically conductive coating portions 12a and 12b are connected to a vehicle controller 84 via conventional wiring 82.

A conventional vehicle steering wheel may include built-in control buttons for functions such as cruise control, lights, audio system, etc. In operation, a user of the presses a control button to enact a corresponding function. Unlike a conventional vehicle steering wheel, steering wheel 80 includes cover assembly 10 in place of at least some of the built-in control buttons. As described, cover assembly 10 includes a cover 14 and electrically conductive coating layer 12 having electrically conductive coating portions 12a and 12b. Electrically conductive coating portions 12a and 12b function as electrically conductive touch controls or switches. For example, electrically conductive portion 12a functions as a first touch control for enacting a first function and electrically conducive portion 12b functions as a second touch control for enacting a second function.

In operation, a user presses electrically conductive coating portion 12a (or 12b) to enact a corresponding function. Upon the user pressing electrically conductive coating portion 12a (or 12b), a control electric signal is communicated from the electrically conductive coating portion 12a to vehicle controller 84. In turn, vehicle controller 84 enacts a corresponding function.

In embodiments, an electrically conductive coating layer is applied onto a cover by screen printing; digital printing, extruding, or robotics; roll, spray, or curtain and laser etch; deboss and roll. In the roll, spray, or curtain and laser etch techniques, the electrically conductive coating layer is applied over full hide and elements are etched on demand. The deboss and roll technique directly incorporates texture as part of the design element.

As described, in embodiments, one or more electrically conductive coating layers within the A-surface are used in vinyl and non-woven textile applications. The electrically conductive coating layer can also be applied in patterns to optimize heating performance or provide layered degrees of climate control comfort.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A vehicle interior assembly, comprising:
a frame; and
a cover assembly covering the frame, the cover assembly including a cover that is a vinyl or non-woven textile and an electrically conductive coating layer within an A-surface of the cover,
wherein the electrically conductive coating layer comprises a first plurality of conductive areas and a second plurality of conductive areas, which are independently connected to a wiring of an electrical power source of a vehicle configured to enable selective heating of the first plurality of conductive areas and the second plurality of conductive areas.

2. The vehicle interior assembly of claim 1, wherein:
the cover assembly further includes a base coat on the cover, a color coat, and a topcoat on the color coat, the electrically conductive coating layer being between the base coat and the color coat.

3. The vehicle interior assembly of claim 1, wherein:
the electrically conductive coating layer functions as an electrical resistance heater and is connectable to wiring of an electrical power source of a vehicle.

4. The vehicle interior assembly of claim 1, wherein:
the electrically conductive coating layer functions as an electrically conductive touch control and is connectable to wiring of a control system of a vehicle.

5. The vehicle interior assembly of claim 1, wherein:
the electrically conductive coating functions as electroluminescent or electrochromic lighting and is connectable to wiring of a lighting system of a vehicle.

6. The vehicle interior assembly of claim 1, wherein: the vehicle interior assembly is a vehicle seat.

7. The vehicle interior assembly of claim 1, wherein: the vehicle interior assembly is a steering wheel.

8. The vehicle interior assembly of claim 1, wherein:
the electrically conductive coating layer includes a plurality of electrically conductive coating film areas, the electrically conductive coating film areas patterned or spaced apart with conductive traces to allow perforation or quilting of the cover.

9. A vehicle interior assembly, comprising:
a frame; and
a cover assembly covering the frame, the cover assembly including a cover, a first electrically conductive coating layer within an A-surface of the cover, a second electrically conductive coating layer within the A-surface of the cover, and an insulator sandwiched between the first and second electrically conductive coating layers within the A-surface of the cover, and
wherein one of the first electrically conductive coating layer and the second electrically conductive coating layer functions as an electrical resistance heater and is connectable to wiring of an electrical power source of a vehicle and the other one of the first and second electrically conductive coating layers functions as a capacitive conductive touch control and is connectable to wiring of a control system of the vehicle, and
wherein one of the first electrically conductive coating layer or the second electrically conductive coating layers functioning as the electrical resistance heater comprises a first plurality of conductive areas and a second plurality of conductive areas, which are independently connectable to a wiring of an electrical power source of a vehicle configured to enable selective heating of the first plurality of conductive areas and the second plurality of conductive areas.

10. The vehicle interior assembly of claim 9, wherein: the cover is a vinyl or a non-woven textile.

11. The vehicle interior assembly of claim 9, wherein: the cover is a leather.

12. The vehicle interior assembly of claim 9, wherein: the first electrically conductive coating layer functions as the electrical resistance heater and the second electrically conductive coating layer functions as a capacitive conductive touch control.

13. The vehicle interior assembly of claim 9, wherein: the vehicle interior assembly is a vehicle seat.

14. The vehicle interior assembly of claim 9, wherein: the vehicle interior assembly is a steering wheel.

15. A vehicle interior assembly, comprising:
a frame;
a cover assembly covering the frame, the cover assembly including a cover, an electrically conductive coating layer within an A-surface of the cover, and a Positive Temperature Coefficient (PTC) coating layer within the A-surface of the cover and in physical contact with the electrically conductive coating layer;
wherein the electrically conductive coating layer functions as an electrical resistance heater dependent on an amount of electrical current received from an electrical power source via the PTC coating layer; and the PTC coating layer regulates the amount of electrical current received by the electrically conductive coating layer, which is in physical contact with the PTC coating layer, from the electrical power source dependent on a temperature of the PTC coating layer.

16. The vehicle interior assembly of claim 15, wherein: the cover is a vinyl or a non-woven textile.

17. The vehicle interior assembly of claim 15, wherein: the cover is a leather.

18. The vehicle interior assembly of claim 15, wherein: the vehicle interior assembly is a vehicle seat.

19. The vehicle interior assembly of claim 15, wherein: the vehicle interior assembly is a steering wheel.

20. The vehicle interior assembly of claim 15, further comprises an insulator layer, which insulates the electrically conductive coating layer and the PTC coating layer.

* * * * *